United States Patent
Sano

(10) Patent No.: US 8,300,483 B2
(45) Date of Patent: Oct. 30, 2012

(54) TIMING ADJUSTMENT CIRCUIT, TIMING ADJUSTMENT METHOD, AND CORRECTION VALUE COMPUTING METHOD

(75) Inventor: Hiroyuki Sano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 211 days.

(21) Appl. No.: 12/784,029

(22) Filed: May 20, 2010

(65) Prior Publication Data

US 2010/0296351 A1  Nov. 25, 2010

(30) Foreign Application Priority Data

May 21, 2009  (JP) .................................. 2009-123459

(51) Int. Cl.
    *G11C 7/00*  (2006.01)
(52) U.S. Cl. .... 365/193; 365/191; 365/194; 365/189.07
(58) Field of Classification Search .................. 365/193, 365/158, 194, 191, 189.07
    See application file for complete search history.

(56) References Cited

U.S. PATENT DOCUMENTS

| | | | | |
|---|---|---|---|---|
| 6,125,157 A * | 9/2000 | Donnelly et al. | ............. | 375/371 |
| 6,194,930 B1 * | 2/2001 | Matsuzaki et al. | ............. | 327/156 |
| 6,342,796 B2 * | 1/2002 | Jung | ............................. | 327/141 |
| 6,525,988 B2 * | 2/2003 | Ryu et al. | ........................ | 365/194 |
| 6,901,013 B2 * | 5/2005 | Jones et al. | .................... | 365/194 |
| 7,620,094 B2 * | 11/2009 | Yoneda | ......................... | 375/130 |

FOREIGN PATENT DOCUMENTS

JP  2005-142859 A  6/2005

* cited by examiner

*Primary Examiner* — Pho M Luu
(74) *Attorney, Agent, or Firm* — Arent Fox LLP

(57) ABSTRACT

A timing adjustment circuit includes a determination unit for outputting delay information corresponding to a period of a first input signal, a storing unit for storing a plurality of correction values based on a circuit included in the determination unit, a correction unit for correcting the delay information based on a correction value selected from the plurality of the correction values, based on the delay information, and a first delay line for delaying a second input signal corresponding to the first input signal, based on the delay information corrected by the correction unit.

10 Claims, 3 Drawing Sheets

| ZONE | LOCK NUMBER-OF-DELAY-STAGES VALUE DtL | FIRST NUMBER-OF-STAGES CORRECTION VALUE C1 | SECOND NUMBER-OF-STAGES CORRECTION VALUE C2 |
|---|---|---|---|
| Z1 | 00_0000_0000~00_0000_1111 (0) (15) | 1000 (8) | 1110 (14) |
| Z2 | 00_0001_0000~00_0001_1111 (16) (31) | 0111 (7) | 1100 (12) |
| Z3 | 00_0010_0000~00_0011_1111 (32) (63) | 0110 (6) | 1010 (10) |
| Z4 | 00_0100_0000~00_0111_1111 (64) (127) | 0111 (5) | 1000 (8) |
| Z5 | 00_1000_0000~00_1111_1111 (128) (255) | 0100 (4) | 0110 (6) |
| Z6 | 01_0000_0000~01_1111_1111 (256) (511) | 0011 (3) | 0100 (4) |
| Z7 | 10_0000_0000~11_1111_1111 (512) (1023) | 0010 (2) | 0010 (2) |

( ): DECIMAL NUMBER

TIMING ADJUSTMENT CIRCUIT, TIMING ADJUSTMENT METHOD, AND CORRECTION VALUE COMPUTING METHOD

CROSS-REFERENCE TO RELATED APPLICATION

This application is based upon and claims the benefit of priority of the prior Japanese Patent Application No. 2009-123459, filed on May 21, 2009, the entire contents of which are incorporated herein by reference.

FIELD

The embodiment discussed herein relates to a timing adjustment circuit, a timing adjustment method, and correction value computing method.

BACKGROUND

A semiconductor device includes a delay locked loop (DLL) circuit configured to generate an internal clock signal which is a signal obtained by delaying an externally input external clock signal by an amount of time in accordance with specifications, and to output the internal signal to other circuits. An example of a DLL circuit is a master/slave DLL circuit.

A master/slave DLL circuit includes a master DLL circuit and a slave DLL circuit. The master DLL circuit generates delay control values for delaying the phase of an externally input reference clock signal from 0° to 360°, for example, and thereby detects a delay control value (lock delay control signal) obtained when the reference clock signal is delayed by a phase of approximately 360°. The slave DLL circuit delays an externally input external clock signal by a desired phase based on the detected lock delay control value and a phase setting value provided from an external apparatus.

In the DLL circuit, the slave DLL circuit delays an external clock signal by a desired phase based on the lock delay control value generated by the master DLL circuit and outputs the delayed signal as an internal clock signal.

A DLL circuit may be used in, for example, a double-data-rate synchronous dynamic random access memory (DDR-SDRAM) interface. The DLL circuit generates an internal signal delayed by approximately 90° with respect to an external clock signal.

A DDR-SDRAM, which allows data transfer in synchronization with both the rising edge and falling edge of an external clock signal, realizes a throughput which is twice the throughput of a typical SDRAM. In accordance with the DDR-SDRAM specifications, the transmission and reception timings of a data signal are controlled using a data strobe signal.

The phases of the data strobe signal and data signal are adjusted respectively at the time of data transmission (write) from an interface circuit to a DDR-SDRAM and at the time of data reception (read) in the interface circuit so that the transmission and reception timings of a data signal are controlled.

In the writing operation, the data strobe signal and data signal are generated respectively at the rising edge and falling edge of an external clock signal, and the DLL circuit delays the data strobe signal by a phase of approximately 90°. The data strobe signal and data signal are transmitted to the DDR-SDRAM through the interface circuit.

In the reading operation, since the data strobe signal and data signal received from the DDR-SDRAM via the interface circuit are synchronized at substantially the same timings, the DLL circuit delays the data strobe signal by a phase of approximately 90° and the received data signal is read in synchronization with the data strobe signal delayed by approximately 90°.

The master DLL circuit includes a first delay circuit, a phase comparator circuit, and a delay control circuit.

The first delay circuit generates a delayed reference clock signal by delaying the phase of a reference clock signal received from an external apparatus in accordance with a delay control value supplied from the delay control circuit. The phase comparator circuit receives the reference clock signal and the delayed reference clock signal from the first delay circuit. The phase comparator circuit detects the phase difference between the delayed reference clock signal and the reference clock signal, and outputs the detection result to the delay control circuit as a phase difference value.

The delay control circuit, based on the phase difference value from the phase comparator circuit, generates delay control values which cause the first delay circuit to delay the phase of the reference clock signal, for example, from 0° to 360°. When the delayed reference clock signal is delayed by a phase of approximately 360° with respect to the reference clock signal and enters a substantially synchronized (locked) state, the delay control circuit holds the delay control value (lock delay control value).

The slave DLL circuit includes a second delay circuit and a phase adjustment circuit.

The second delay circuit generates an internal clock signal that is obtained by delaying the phase of an external clock signal received from an external apparatus in accordance with a phase adjustment value. The phase adjustment circuit receives the lock delay control value received from the master DLL circuit and phase setting data received from the external apparatus. The phase adjustment circuit, based on the lock delay control value and the phase setting value data, generates a phase adjustment value that causes the phase of the external clock signal to be delayed to reach a desired phase through the second delay circuit, whereby the internal clock signal is generated. The phase adjustment circuit outputs the phase adjustment value to the second delay circuit.

A plurality of slave DLL circuits are provided for each master DLL circuit in a semiconductor device. Since wire delay times generated by wires from the slave DLL circuit to respective circuits arranged in the semiconductor device are averaged, the variations among the internal clock signals input to the circuits arranged in the semiconductor device may be decreased.

In recent years, in accordance with an increase in clock signal speeds, there have been efforts to reduce the phase variations among internal clock signals input to circuits arranged in a semiconductor device.

When a plurality of slave DLL circuits are arranged in a semiconductor device, as described above, processing variations may cause the slave DLL circuits to delay phases by different amounts even when the same phase adjustment value is input.

Processing variations among the second delay circuits of the slave DLL circuits may be corrected by feeding back internal clock signals generated by the slave DLL circuits to the phase comparator circuit of the master DLL circuit, and thereby comparing, in the phase comparator circuit, the fed back internal clock signals and the external clock signal whose phase has been delayed by the first delay circuit (for example, JP2005-142859).

However, the DLL circuit described above fails to address the wiring delay caused by a wire between the first delay circuit and phase comparator circuit of the master DLL circuit, and the delay times caused by the input buffer circuits and output buffer circuits provided in the second delay circuits within the slave DLL circuits. Hence, the DLL circuit described above may fail to delay the phase of an internal clock signal by a desired value.

SUMMARY

According to an aspect of the embodiment, a timing adjustment circuit includes a determination unit for outputting delay information corresponding to a period of a first input signal; a storing unit for storing a plurality of correction values in accordance with a circuit included in the determination unit; a correction unit for correcting the delay information based on a correction value selected from the plurality of the correction values, in accordance with the delay information; and a first delay line for delaying a second input signal corresponding to the first input signal, in accordance with the delay information corrected by the correction unit.

According to another aspect of the embodiment, a timing adjustment method includes outputting delay information corresponding to a period of a first input signal; selecting a correction value in accordance with the delay information from a plurality of correction values stored in a storing unit; correcting the delay information based on the correction value in accordance with the delay information, thereby generating corrected delay information; and delaying a second input signal corresponding to the first input signal, in accordance with the corrected delay information.

According to another aspect of the embodiment, a correction value computing method includes measuring a first delay amount corresponding to a period of a first input signal under each of a plurality of conditions for a second delay line, based on a timing of the first input signal and a timing of a signal transmitted through the second delay line and a wire coupled to the second delay line; measuring a second delay amount corresponding to the period of the first input signal under each of the plurality of the conditions, based on the timing of the first input signal and a timing of a signal transmitted through the second delay line; and computing a plurality of correction values corresponding to the first input signal based on a difference between the first delay amount and the second delay amount.

The object and advantages of the embodiment may be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 2 is a data table according to the embodiment; and

DESCRIPTION OF EMBODIMENT

Figure 1:
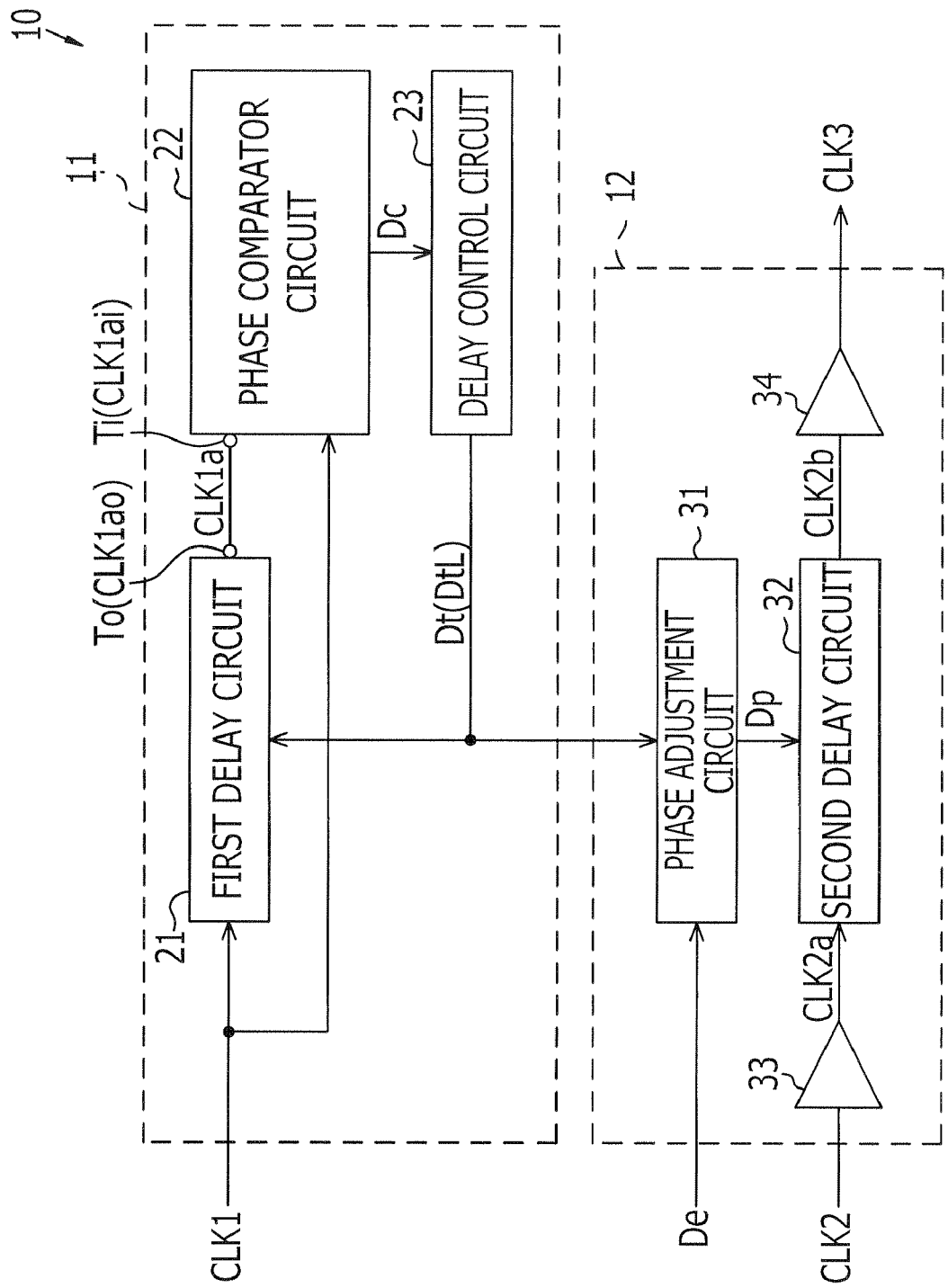
FIG. 1 illustrates a DLL circuit according to an embodiment.

FIG. 1 illustrates a DLL circuit 10 according to an embodiment.

As illustrated in FIG. 1, the DLL circuit 10 includes a master DLL circuit 11 and a slave DLL circuit 12.

The master DLL circuit 11 includes a first delay circuit 21, a phase comparator circuit 22, and a delay control circuit 23. The first delay circuit 21 includes a plurality of buffer circuits as delay stages (for example, CMOS transistor delay devices, not illustrated), and receives a reference clock signal CLK1 from an external apparatus (not illustrated) value.

A value Dt is the value of the number of buffer circuits (delay devices) coupled in series between the input and output terminals of the first delay circuit 21. The first delay circuit 21 receives the value Dt from the delay control circuit 23. For example, the value Dt is 10 bit data and specifies the number of delay stages ranging from "0000000000" to "1111111111", that is, "0" to "1023" in decimal notation.

The first delay circuit 21 increases and/or decreases the number of buffer circuits (delay devices) to be coupled in series in accordance with the value Dt. The first delay circuit 21 delays the reference clock signal CLK1 received from the input terminal in accordance with the number of buffer circuits (delay devices) coupled in series and outputs the delayed signal from the output terminal to the phase comparator circuit 22 as a comparison clock signal CLK1a.

For example, upon receiving the value Dt indicating "0", the first delay circuit 21 does not cause a buffer circuit (delay device) to be coupled between the input and output terminals, thereby providing the shortest delay time. Similarly, upon receiving the value Dt indicating "1023", for example, the first delay circuit 21 causes 1023 buffer circuits (delay devices) to be coupled between the input and output terminals, thereby providing the longest delay time.

When the value Dt indicating "0" is input to the first delay circuit 21, the phase difference between the reference clock signal CLK1 and the comparison clock signal CLK1a may decrease. Alternatively, when the value Dt indicating "1023" is input to the first delay circuit 21, the phase difference between the reference clock signal CLK1 and the comparison clock signal CLK1a may increase.

The phase comparator circuit 22 receives the reference clock signal CLK1 from the external apparatus and the comparison clock signal CLK1a from the first delay circuit 21. The phase comparator circuit 22 detects the phase difference between the input reference clock signal CLK1 and the comparison clock signal CLK1a, and outputs a phase difference value Dc as the detection result to the delay control circuit 23. In other words, the phase comparator circuit 22 generates and outputs to the delay control circuit 23 the phase difference value Dc, which is the phase difference (e.g., 0° to 360°) between the comparison clock signal CLK1a and the reference clock signal CLK1.

The delay control circuit 23 receives the phase difference value Dc from the phase comparator circuit 22. The delay control circuit 23 increases the value Dt and the phase difference value Dc changes, for example, from 0° to 360°. In other words, the delay control circuit 23 causes the comparison clock signal CLK1a to be increasingly delayed with respect to the reference clock signal CLK1 by increasing the delay time of the first delay circuit 21.

The delay control circuit 23 continues to increase the value Dt to a lock number-of-delay-stages value DtL at which the phase difference between the comparison clock signal CLK1a and the reference clock signal CLK1 reaches approximately 360° and a substantially synchronized (locked) state is entered. The lock number-of-delay-stages value DtL is hereinafter referred to as the lock value DtL.

For example, the delay control circuit 23 outputs the value Dt indicating "0", and a buffer circuit (delay device) is not coupled between the input and output terminals of the first delay circuit 21. The delay control circuit 23 outputs the value Dt indicating "1", for example, and one buffer circuit (delay device) is coupled between the input and output terminals of the first delay circuit 21.

The delay control circuit 23 outputs the value Dt indicating "2", for example, and two buffer circuits (delay devices) are coupled in series between the input and output terminals of the first delay circuit 21. The delay control circuit 23 outputs the value Dt indicating "3", for example, and three buffer circuits (delay devices) are coupled in series between the input and output terminals of the first delay circuit 21. As the number of delay stages increases, for example, one by one, the number of buffer circuits coupled between the input and output terminals of the first delay circuit 21 increases, for example, one by one. When the delay control circuit 23 outputs the value Dt indicating "1023", for example, 1023 buffer circuits (delay devices) are coupled in series between the input and output terminals of the first delay circuit 21.

As described above, the value Dt continues to increase, and when the delay control circuit 23 receives the phase difference value Dc obtained when the phase difference between the comparison clock signal CLK1a and the reference clock signal CLK1 is approximately 360°, the delay control circuit 23 outputs the lock value DtL.

Note that the lock value DtL for synchronizing (locking) the comparison clock signal CLK1a with the reference clock signal CLK1 by delaying the comparison clock signal CLK1a by approximately 360° may change depending on the conditions such as processing, power supply voltage, and temperature.

The slave DLL circuit 12 includes a phase adjustment circuit 31, as a correction unit, and a second delay circuit 32, as a first delay line, that includes a plurality of buffer circuits as delay stages (for example, CMOS transistor delay devices) with substantially the same configurations as the configurations for the first delay circuit 21.

The phase adjustment circuit 31 receives the value Dt from the master DLL circuit 11, and phase adjustment data De from the external apparatus (not illustrated). The phase adjustment data De is data of a phase setting value Y that indicates the phase difference between an internal clock signal CLK3 generated by the slave DLL circuit 12 and an external clock signal CLK2. Note that the frequencies of the external clock signal CLK2 and the internal clock signal CLK3 are substantially the same as the frequency of the reference clock signal CLK1.

For example, the phase setting value Y may indicate "1" to "8", and is input to the phase adjustment circuit 31 as the phase adjustment data De that is 3 bit data. In other words, the phase setting value Y may be set by shifting the phase of internal clock signal CLK3 with respect to the external clock signal CLK2 in units of, for example, 45° (360° divided by eight).

For example, when the internal clock signal CLK3 is delayed by approximately 45° with respect to the external clock signal CLK2, the phase setting value Y is "1", and the phase adjustment data De is "000". Similarly, when the internal clock signal CLK3 is delayed by, for example, 90° with respect to the external clock signal CLK2, the phase setting value Y is "2", and the phase adjustment data De is "001". When the phase setting value Y is increased by "1", the phase adjustment data De is increased by "001". For example, when the internal clock signal CLK3 is delayed by approximately 360° with respect to the external clock signal CLK2, the phase setting value Y is "8" and the phase adjustment data De is "111".

Note that in the present embodiment, the internal clock signal CLK3 is delayed by approximately 90° with respect to the external clock signal CLK2, and the phase setting value Y is "2" and the phase adjustment data De is "001".

FIG. 2 is a data table T1 according to the embodiment.

The phase adjustment circuit 31 in FIG. 1 stores the data table T1 including, for example, a first number-of-stages correction value C1 and a second number-of-stages correction value C2 for each of the lock values DtL.

The comparison clock signal CLK1a output from the first delay circuit 21 is delayed by the capacitance and resistance of the wiring between the first delay circuit 21 and the phase comparator circuit 22. Hence, the phase comparator circuit 22 of the master DLL circuit 11, when detecting a phase difference between the comparison clock signal CLK1a and the reference clock signal CLK1, detects the phase difference between the reference clock signal CLK1 and the comparison clock signal CLK1a that includes a delay time that occurs in the wiring, and outputs the detection result to the delay control circuit 23 as the phase difference value Dc.

The value Dt output from the delay control circuit 23 to the first delay circuit 21 is not based on the delay time by which the comparison clock signal CLK1a is delayed due to the wiring.

Preferably, the delay time by which the comparison clock signal CLK1a is delayed due to the wiring is converted into a corresponding number of buffer circuits (delay devices), and the number of buffer circuits is added to the lock value DtL output from the delay control circuit 23.

An input buffer circuit 33 and an output buffer circuit 34 are respectively coupled to the input terminal and output terminal of the second delay circuit 32 of the slave DLL circuit 12. A clock signal is delayed by the input buffer circuit 33 and the output buffer circuit 34, and the delay time is converted into a corresponding number of buffer circuits (delay devices), which is subtracted from the lock value DtL.

In other words, the first number-of-stages correction value C1 is a correction value that is a delay time due to wiring converted into the number of buffer circuits (delay devices), for the lock value DtL.

Similarly, the second number-of-stages correction value C2 is a correction value that is a delay time due to the input buffer circuit 33 and the output buffer circuit 34 of the slave DLL circuit 12 converted into the number of buffer circuits (delay devices), for the lock value DtL. For example, each of the first and second number-of-stages correction values C1 and C2 is a 4 bit value.

In the data table T1 in FIG. 2, the lock values Dth are divided into a plurality of zones, for example, Z1 to Z7, and the first and second number-of-stages correction values C1 and C2 are set for each of the zones Z1 to Z7.

For example, for the first delay time zone Z1 corresponding to the lock values DtL "0" to "15", "8" is stored as the first number-of-stages correction value C1 and "14" is stored as the second number-of-stages correction value C2. Similarly, for the second delay time zone Z2 corresponding to the lock values DtL "16" to "31", for example, "7" is stored as the first number-of-stages correction value C1 and "12" is stored as the second number-of-stages correction value C2. For the third delay time zone Z3 corresponding to the lock values DtL "32" to "63", for example, "6" is stored as the first number-of-stages correction value C1 and "10" is stored as the second number-of-stages correction value C2. For the fourth, fifth, and sixth delay time zones Z4, Z5, and Z6, for example, the values C1 and C2 in FIG. 2 are stored. For the seventh delay time zone Z7 corresponding to the lock values DtL "512" to "1023", for example, "2" is stored as the first number-of-stages correction value C1 and "2" is stored as the second number-of-stages correction value C2.

The smaller the lock value DtL, the larger the first and second number-of-stages correction values C1 and C2, while the larger the lock value DtL, the smaller the first and second number-of-stages correction values C1 and C2.

The smaller the lock value DtL, the larger the delay time per buffer circuit (delay device). When the lock value DtL is small, a small number of buffers (delay devices) are used to delay the comparison clock signal CLK1a by a phase of approximately 360° with respect to the reference clock signal CLK1, in accordance with the processing, power supply voltage, and temperature conditions.

Similarly, the delay time that occurs in the wiring between the first delay circuit 21 and the phase comparator circuit 22 of the master DLL circuit 11 and the delay time caused by the input buffer circuit 33 and the output buffer circuit 34 of the slave DLL circuit 12 increase as the lock value DtL decreases. Accordingly, the smaller the lock value DtL, the larger the first and second number-of-stages correction values C1 and C2.

Alternatively, the larger the lock value DtL, the smaller the delay time per buffer circuit (delay device). When the lock value DtL is large, a large number of buffers (delay devices) are used to delay the comparison clock signal CLK1a by a phase of approximately 360° with respect to the reference clock signal CLK1, in accordance with the processing, power supply voltage, and temperature conditions.

Similarly, the delay time that occurs in the wiring between the first delay circuit 21 and the phase comparator circuit 22 of the master DLL circuit 11 and the delay time caused by the input buffer circuit 33 and the output buffer circuit 34 of the slave DLL circuit 12 decrease as the lock value DtL increases. Accordingly, the larger the lock value DtL, the smaller the first and second number-of-stages correction values C1 and C2.

The phase adjustment circuit 31 generates and outputs to the second delay circuit 32 a phase adjustment value Dp based on the lock value DtL, the phase adjustment data De, and the first and second number-of-stages correction values C1 and C2. The phase adjustment value Dp indicates the number of buffer circuits (delay devices) to be coupled in series between the input and output terminals of the second delay circuit 32.

For example, the phase adjustment value Dp is given by the following equation.

$$Dp=(DtL+C1) \cdot Y/2^X-C2$$

wherein "DtL" is the lock value, "Y" is the phase setting value, "C1" is the first number-of-stages correction value, "X" is the number of bits of the phase adjustment data De, and "C2" is the second number-of-stages correction value.

The phase adjustment circuit 31 multiplies the lock value DtL by a ratio of (the amount of phase shift of the external clock signal CLK2 set by the phase setting value Y)/(the amount of the shifted phase (approximately 360°) of the reference clock signal CLK1). The phase adjustment circuit 31 also computes the number of buffer circuits (delay devices) in the second delay circuit 32 by which the external clock signal CLK2 is delayed so that the phase is set by the phase setting value Y. In addition, the phase adjustment circuit 31 incorporates the first number-of-stages correction value C1 and the second number-of-stages correction value C2 into the computed number of buffer circuits (delay devices) of the second delay circuit 32, thereby generating the phase adjustment value Dp.

The second delay circuit 32 receives the phase adjustment value Dp from the phase adjustment circuit 31 and the external clock signal CLK2 as an external clock signal CLK2a from the external apparatus (not illustrated) via the input buffer circuit 33.

The second delay circuit 32 generates an external clock signal CLK2b by delaying the external clock signal CLK2a in accordance with the phase adjustment value Dp. The second delay circuit 32 outputs the generated external clock signal CLK2b as the internal clock signal CLK3 through the output buffer circuit 34. In other words, the second delay circuit 32 outputs the internal clock signal CLK3 obtained by delaying the phase of the external clock signal CLK2 input from the external apparatus by the phase (approximately 90° in the present embodiment) specified by the phase setting value Y by connecting the buffer circuits (delay devices) in series in accordance with the phase adjustment value Dp.

Figure 3A:
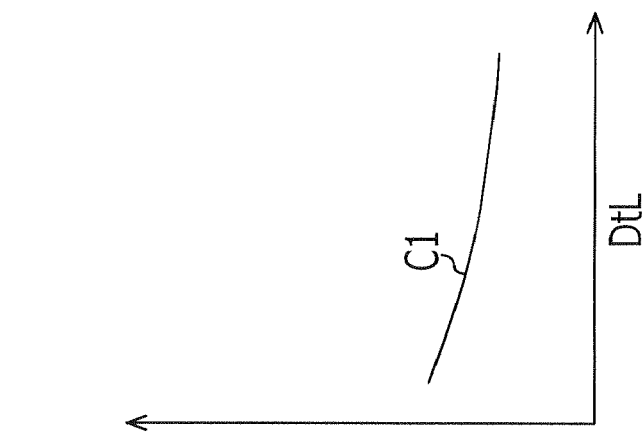
FIGS. 3A to 3C are graphs for explaining a method of computing a first number-of-stages correction value.
Figure 3B:
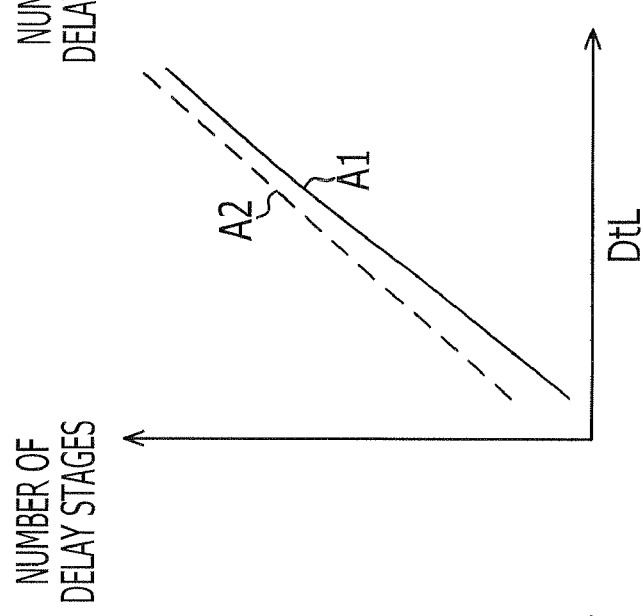
Figure 3C:
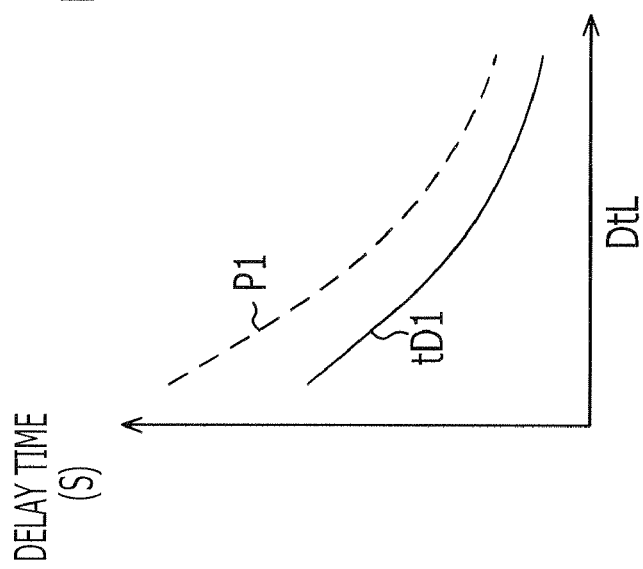

FIGS. 3A to 3C are graphs for explaining a method of computing the first number-of-stages correction value C1 corresponding to each of the first to seventh delay time zones Z1 to Z7 of the data table T1 in FIG. 2.

The comparison clock signal CLK1a (=CLK1ao) at an output terminal To of the first delay circuit 21 of the master DLL circuit 11 is simulated, and a phase difference between the comparison clock signal CLK1a (=CLK1ao) and the reference clock signal CLK1 is obtained.

In addition, the comparison clock signal CLK1a (=CLK1ai) at an input terminal Ti of the phase comparator circuit 22 is simulated, and a phase difference between the comparison clock signal CLK1a (=CLK1ai) and the reference clock signal CLK1 is obtained. The simulation is performed under the various conditions (maximum value, standard value, and minimum value) of the processing, power supply voltage, and temperature.

For example, the conditions for the power supply voltage are: maximum value="1.3 V", standard value="1.2 V", and minimum value="1.1 V". The conditions for the temperature are: maximum value "125° C.", standard value="25° C.", and minimum value="−40° C.". The three conditions for the processing are, for example, "fast", "normal", and "slow". Here, the processing conditions "fast", "normal", and "slow" respectively correspond to the conditions in which the driving capability of transistors is high, standard, and low.

By changing the processing, power supply voltage, and temperature conditions as described above, the delay time per buffer circuit (delay device), and hence, the lock value DtL are made to vary.

FIGS. 3A to 3C illustrate the results of the simulation, performed under the above-described processing, power supply voltage, and temperature conditions, regarding a delay time tD1 per buffer circuit (delay device) of the first delay circuit 21 and a phase difference P1 between the comparison clock signal CLK1ai and the comparison clock signal CLK1ao.

Referring to FIG. 3A, the horizontal axis illustrates the lock value DtL and the vertical axis illustrates the delay time tD1 per buffer circuit (delay device) of the first delay circuit 21. The larger the lock value DtL, the smaller the delay time tD1 per buffer circuit (delay device). Alternatively, the smaller the lock value DtL, the larger the delay time tD1 per buffer circuit (delay device).

Similarly, the larger the lock value DtL, the smaller the phase difference P1 between the comparison clock signal CLK1ai and the comparison clock signal CLK1ao. Alternatively, the smaller the lock value DtL, the larger the phase difference P1 between the comparison clock signal CLK1ai and the comparison clock signal CLK1ao.

The phase difference P1 between the comparison clock signal CLK1ai and the comparison clock signal CLK1ao is generated due to waveform rounding caused by the capacitance and resistance of the wiring between the first delay circuit 21 and the phase comparator circuit 22. The waveform rounding depends on the driving capability of the buffer circuits (delay devices) of the first delay circuit 21.

Hence, the phase difference P1 between the comparison clock signal CLK1ai and the comparison clock signal CLK1ao has a correlation with the waveform rounding caused by the capacitance and resistance of the wiring between the first delay circuit 21 and the phase comparator circuit 22. In addition, the delay time tD1 per buffer circuit (delay device) of the first delay circuit 21 depends on the driving capability of the buffer circuits (delay devices) of the first delay circuit 21. Accordingly, the phase difference P1 between the comparison clock signal CLK1ai and the comparison clock signal CLK1ao has correlation with the delay time tD1 per buffer circuit (delay device) of the first delay circuit 21.

FIG. 3B illustrates the relations A1 and A2 between the lock value DtL and the number of delay stages. The relation A1 indicates the relation between the lock value DtL and the number of buffer circuits (delay devices) used for shifting the phase of the reference clock signal CLK1 by approximately 360° when considering waveform rounding. The relation A2 indicates the relation between the lock value DtL and the number of buffer circuits (delay devices) used for shifting the phase of the reference clock signal CLK1 by approximately 360° without considering waveform rounding. As illustrated in FIG. 3B, the number of buffer circuits according to the relation A1 is smaller than the number of buffer circuits according to the relation A2. The difference between the number of buffer circuits according to the relation A1 and the number of buffer circuits according to the relation A2 decreases as the lock value DtL increases.

When waveform rounding is considered, that is, when the capacitance and resistance of the wiring between the first delay circuit 21 and the phase comparator circuit 22 are considered, the lock value DtL is decreased by the number of buffer circuits (delay devices) to cause a delay approximately equal to the delay caused by the capacitance and resistance of the wiring between the first delay circuit 21 and the phase comparator circuit 22. Accordingly, even if the buffer circuits (delay devices) are coupled in series with a number based on the lock value DtL obtained when waveform rounding is considered, the second delay circuit 32 may not delay the external clock signal CLK2 by approximately 360°.

In order for the second delay circuit 32 to delay the external clock signal CLK2 by approximately 360°, the number of buffer circuits (delay devices) for causing a delay approximately equal to the delay due to the capacitance and resistance of the wiring between the first delay circuit 21 and the phase comparator circuit 22 is preferably added to the lock value DtL. In other words, the difference between the number of buffer circuits according to the relation A1 and the number of buffer circuits according to the relation A2, as illustrated in FIG. 3B, is preferably added to the lock value DtL.

FIG. 3C illustrates the difference between the number of buffer circuits according to the relation A1 in FIG. 3B and the number of buffer circuits according to the relation A2 in FIG. 3B. The first number-of-stages correction value C1 in FIG. 3C indicates the number of buffer circuits (delay devices) to be added to the lock value DtL. Thus, the first number-of-stages correction value C1 corresponding to the lock value DtL may be obtained.

As described above, the second number-of-stages correction value C2 is a value for correcting for a delay time caused by the input buffer circuit 33 and the output buffer circuit 34. There is a correlation between a delay time of the buffer circuits (delay devices) of the first delay circuit 21 and a delay time caused by the input buffer circuit 33 and the output buffer circuit 34. Hence, the ratio of the delay time of the buffer circuits (delay devices) of the first delay circuit 21 and the delay time caused by the input buffer circuit 33 and the output buffer circuit 34 is obtained by using simulation.

As illustrated in FIG. 3A, since the delay time tD1 per buffer circuit (delay device) of the first delay circuit 21 is obtained from the lock value DtL, the delay time caused by the input buffer circuit 33 and the output buffer circuit 34 may be computed by detecting the lock value DtL.

The number of buffer circuits (delay devices) that causes a delay time approximately equal to the delay time caused by the input buffer circuit 33 and the output buffer circuit 34 is subtracted as the second number-of-stages correction value C2 from the lock value DtL, whereby correction is made. Hence, the second number-of-stages correction value C2 may be obtained by detecting the lock value DtL.

According to the present embodiment, the following advantages are described above.

(1) The slave DLL circuit 12 may generate the internal clock signal CLK3 by delaying the external clock signal CLK2 by a desired phase with high accuracy through correction made by adding the first number-of-stages correction value C1 to the lock value DtL.

(2) Further, the slave DLL circuit 12 may generate the internal clock signal CLK3 by delaying the external clock signal CLK2 by a desired phase with higher accuracy through correction made by subtracting the second number-of-stages correction value C2 from the phase adjustment value Dp.

The above-described embodiment may also be realized by the following embodiments.

In the embodiment described above, the master DLL circuit 11 included one slave DLL circuit 12, but the number of the slave DLL circuits 12 is not limited to this configuration.

In the embodiment described above, the first delay circuit 21 and the second delay circuit 32 each have a circuit configuration in which a plurality of buffer circuits (delay devices) are coupled in series. However, the first delay circuit 21 and the second delay circuit 32 are not limited to this configuration as long as a delay time by which an input signal is delayed can be changed. For example, the first delay circuit 21 and the second delay circuit 32 may have configurations in which the delay time is controlled in accordance with a control voltage.

In the embodiment described above, the phase adjustment circuit 31 computed the first number-of-stages correction value C1 that corrects for a delay time generated by a wire from the first delay circuit 21 to the phase comparator circuit 22. However, are not limited to this configuration, the first number-of-stages correction value C1 may correct for a delay time generated due to a wire between the first delay circuit 21 and a branch node at which the reference clock signal CLK1 is coupled to the first delay circuit 21 and the phase comparator circuit 22.

In the embodiment described above, the phase adjustment circuit 31 computed the second number-of-stages correction value C2 that corrects for a delay time caused by the input buffer circuit 33 and the output buffer circuit 34. However, the phase adjustment circuit 31 may also correct for a delay time caused by a wire from the input buffer circuit 33 to the second delay circuit 32, a wire from the second delay circuit 32 to the output buffer circuit 34, and a wire from the output buffer circuit 34 to a circuit to which the internal clock signal CLK3 is supplied.

The DLL circuit 10 in the embodiment described above may be provided in an interface circuit of a memory (for example, a DDR-SDRAM). In the example, the external clock signal CLK2, after being delayed so as to have a desired phase, is output to the memory as a strobe signal for inputting data transmitted from the memory.

In the embodiment described above, the master DLL circuit 11 receives the reference clock signal CLK1 and the slave DLL circuit 12 receives the external clock signal CLK2. However, are not limited to this configuration, the master DLL circuit 11 and the slave DLL circuit 12 may receive the same clock signal.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a showing of the superiority and inferiority of the embodiment. Although the embodiment of the present invention has been described in detail, it should be understood that the various changes, substitutions, and alterations could be made hereto without departing from the spirit and scope of the invention.

What is claimed is:

1. A timing adjustment circuit comprising:
   a determination unit configured to output delay information corresponding to a period of a first input signal;
   a storing unit configured to store a plurality of correction values in accordance with a circuit included in the determination unit;
   a correction unit configured to correct the delay information based on a correction value selected from the plurality of the correction values, in accordance with the delay information; and
   a first delay line configured to delay a second input signal corresponding to the first input signal, in accordance with the delay information corrected by the correction unit,
   wherein the determination unit includes a second delay line and a wire coupled to the second delay line, and
   wherein the plurality of correction values are generated based on a difference between a first delay amount corresponding to the period of the first input signal and a second delay amount corresponding to the period of the first input signal, the first delay amount being measured based on a timing of the first input signal and a timing of a signal transmitted through the second delay line and the wire, and the second delay amount being measured based on the timing of the first input signal and a timing of a signal transmitted through the second delay line.

2. The timing adjustment circuit according to claim 1, wherein the first delay amount is measured under each of a plurality of conditions for the second delay line and the second delay amount is measured under each of the plurality of the conditions based on the timing of the first input signal and a timing of a signal transmitted through the second delay line.

3. The timing adjustment circuit according to claim 1, wherein the plurality of the correction values are stored in the storing unit in association with the first delay amount as the delay information.

4. The timing adjustment circuit according to claim 2, wherein the plurality of the conditions include at least one of the following: a processing variation associated with the second delay line, a driving power supply voltage associated with the second delay line, and a temperature associated with the second delay line.

5. The timing adjustment circuit according to claim 1, wherein the first delay line and the second delay line are approximately the same configuration.

6. The timing adjustment circuit according to claim 1, wherein an output signal of the second delay line is a strobe signal transmitted to a memory, the delay information is a delay amount corresponding to a period of the strobe signal, and the delay amount of the first delay line is set based on the delay information corrected by the correction unit and setting information for setting a timing of the strobe signal for data.

7. The timing adjustment circuit according to claim 1, wherein the second input signal is a strobe signal for receiving data transmitted from a memory, the delay information is a delay amount corresponding to a period of the strobe signal, and the delay amount of the first delay line is set based on the delay information corrected by the correction unit and setting information for setting a timing of the strobe signal for the data.

8. A timing adjustment method comprising:
   outputting delay information corresponding to a period of a first input signal;
   selecting a correction value in accordance with the delay information from a plurality of correction values stored in a storing unit;
   correcting the delay information based on the correction value in accordance with the delay information, thereby generating corrected delay information; and
   delaying a second input signal corresponding to the first input signal, in accordance with the corrected delay information; and
   generating the plurality of correlation values based on a difference between a first delay amount corresponding to the period of the first input signal and a second delay amount corresponding to the period of the first input signal, the first delay amount being measured based on a timing of the first input signal and a timing of a signal transmitted through a second delay line and a wire coupled to the second delay line, and the second delay amount being measured based on the timing of the first input signal and a timing of a signal transmitted through a second delay line.

9. The timing adjustment method according to claim 8, wherein the first delay amount is measured under each of a plurality of conditions for the second delay line and the second delay amount is measured under each of the plurality of the conditions.

10. A correction value computing method comprising:
    measuring a first delay amount corresponding to a period of a first input signal under each of a plurality of conditions for a second delay line, based on a timing of the first input signal and a timing of a signal transmitted through the second delay line and a wire coupled to the second delay line;
    measuring a second delay amount corresponding to the period of the first input signal under each of the plurality of the conditions, based on the timing of the first input signal and a timing of a signal transmitted through the second delay line; and
    computing a plurality of correction values corresponding to the first input signal based on a difference between the first delay amount and the second delay amount.

* * * * *